US008054692B2

(12) United States Patent
Kang et al.

(10) Patent No.: US 8,054,692 B2
(45) Date of Patent: Nov. 8, 2011

(54) FLASH MEMORY DEVICE REDUCING NOISE OF COMMON SOURCE LINE, PROGRAM VERIFY METHOD THEREOF, AND MEMORY SYSTEM INCLUDING THE SAME

(75) Inventors: Sang-gu Kang, Suwon-si (KR); Hee-Won Lee, Seoul (KR); Ju-Seok Lee, Jeongeup-si (KR); Jung-Ho Song, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 394 days.

(21) Appl. No.: 12/472,639

(22) Filed: May 27, 2009

(65) Prior Publication Data

US 2010/0002507 A1   Jan. 7, 2010

(30) Foreign Application Priority Data

Jul. 4, 2008  (KR) .................. 10-2008-0065114

(51) Int. Cl.
*G11C 11/34* (2006.01)
*G11C 16/06* (2006.01)
(52) U.S. Cl. ............................. 365/185.25; 365/185.22
(58) Field of Classification Search ............. 365/185.25, 365/185.22, 185.17, 185.02
See application file for complete search history.

(56) References Cited

U.S. PATENT DOCUMENTS

| 6,097,638 | A | 8/2000 | Himeno et al. |
| 7,310,269 | B2 | 12/2007 | Shibata |
| 7,916,542 | B2 * | 3/2011 | Park et al. ................ 365/185.12 |
| 2007/0019478 | A1 | 1/2007 | Kajimoto et al. |
| 2007/0180219 | A1 * | 8/2007 | Iino et al. ...................... 711/209 |
| 2009/0003072 | A1 * | 1/2009 | Hwang et al. ............ 365/185.18 |

FOREIGN PATENT DOCUMENTS

| JP | 10-228792 | 8/1998 |
| JP | 2006-172523 | 6/2006 |
| JP | 2007-026579 | 2/2007 |
| KR | 10-1998-0071285 | 10/1998 |
| KR | 10-2006-0065522 | 6/2006 |

* cited by examiner

*Primary Examiner* — Anh Phung
(74) *Attorney, Agent, or Firm* — F. Chau & Associates, LLC

(57) ABSTRACT

A flash memory device controls a common source line voltage and performs a program verify method. A plurality of memory cells is connected between a bit line and the common source line. A data input/output circuit is connected to the bit line and is configured to store data to be programmed in a selected memory cell of the plurality of memory cells. The data input/output circuit maintains data to be programmed within the data input/output circuit during a program verify operation, and decreases noise in the common source line by selectively precharging the bit line based on the data to be programmed.

20 Claims, 11 Drawing Sheets

FLASH MEMORY DEVICE REDUCING NOISE OF COMMON SOURCE LINE, PROGRAM VERIFY METHOD THEREOF, AND MEMORY SYSTEM INCLUDING THE SAME

CROSS REFERENCE TO RELATED APPLICATIONS

This application claims priority under 35 U.S.C §119 to Korean Patent Application No. 10-2008-0065114, filed on Jul. 4, 2008, in the Korean Intellectual Property Office, the entire contents of which are herein incorporated by reference.

BACKGROUND

1. Technical Field

The present invention is related to a flash memory device, and more particularly, to a flash memory device capable of reducing noise in common source line, a program verify method thereof, and a memory system including the same.

2. Discussion of Related Art

The semiconductor memory device may be generally divided into a volatile memory device, for example, DRAM and SRAM, and a non-volatile memory device, for example, EEPROM, FRAM, PRAM, MRAM and flash memory. A volatile memory device loses stored data when power supply is cut off, but a nonvolatile memory device retains stored data even when power supply is cut off. A flash memory has characteristics such as high programming speed, low consumption of power, and large capacity data storage. Flash memory is therefore used widely as a storage means in computer system and the like.

A flash memory includes a memory cell array that stores data. A memory cell array includes a plurality of memory blocks. The memory blocks each include a plurality of pages. The pages each include a plurality of memory cells. The memory cells may each be either an on-cell or an off-cell according to a threshold voltage distribution of the cell. An on-cell may be considered an erased cell, and an off-cell may be considered a programmed cell. A flash memory performs an erase operation in units of a memory block. This means that in order to erase a memory cell, an entire memory block of memory cells must be erased. A flash memory performs a write or read operation in units of a page. This means that in order to write or read a memory cell, an entire page of memory cells must be written or read.

A flash memory has a cell string structure. A cell string includes a string selection transistor connected to a string selection line SSL, a memory cell connected to a plurality of word lines WL0-WL31, and a ground selection transistor connected to a ground selection line GSL. The string selection transistor is connected to a bit line BL and the ground selection transistor is connected to a common source line CSL.

A flash memory may be able to store either a single bit of data in each memory cell or multiple bits of data may be stored in each memory cell, depending on the type of memory cells used. In general, a memory cell that stores single bit data is called a Single Level Cell (SLC), and a memory cell that stores multiple bits data is called a Multi Level Cell (MLC). The Single Level Cell has an erase state based on threshold voltage and one program state. The Multi Level Cell has an erase state based on threshold voltage and a plurality of program states.

In a flash memory having a Multi Level Cell, margins between each of the states are provided by narrowing the width of the threshold voltage distribution of each state. Noise generated in the common source line CSL may cause the threshold voltage distribution width of each state to be widened and this may reduce or eliminate the margins between each of the states and may therefore reduce reliability. Noise occurs when voltage drops due to resistance in the common source line CSL.

The common source line CSL is generally connected to a ground terminal via a metal line. A voltage drop occurs when current flows through the common source line CSL due to resistance on the metal line. The voltage drop in the common source line CSL is proportionate to the current that flows through the common source line CSL. Accordingly, the voltage drop increases when the current flow increases, and the voltage drop decreases when the current flow decreases. When a common source line voltage is generated due to voltage drop in the common source line CSL, the threshold voltage distribution of the memory cell may be widened.

SUMMARY

Exemplary embodiments of the present invention are related to a flash memory device reducing noise in common source line, program verify method thereof, and memory system including the same. In an exemplary embodiment, a flash memory device may include a plurality of memory cells connected between a bit line and a common source line and a data input/output circuit connected to the bit line. The data input/output circuit is configured to store data to be programmed in a selected memory cell among the plurality of memory cells. The data input/output circuit is configured to maintain the data to be programmed during a program verify operation, and to decrease noise in the common source line by selectively precharging the bit lines based on the data to be programmed.

According to an exemplary embodiment, a program verify method of a flash memory device may include a plurality of memory cells connected between a bit line and a common source line, and a data input/output circuit connected to the bit line. The program verify method includes storing data to be programmed in a selected memory cell of the plurality of memory cells in the data input/output circuit and programming and program verifying the data to be programmed in the selected memory cell. The data input/output circuit is configured to maintain the data to be programmed during a program verify operation, and to decrease noise in the common source line by selectively precharging the bit line based on the data to be programmed.

According to an exemplary embodiment, a memory system may include a flash memory device and a memory controller configured to control the flash memory device. The flash memory device includes a plurality of memory cells connected between a bit line and a common source line and a data input/output circuit connected to the bit line. The data input/output circuit is configured to store data to be programmed in a selected memory cell of the plurality of memory cells. The data input/output circuit is configured to maintain the data to be programmed during a program verify operation, and to decrease noise in the common source line by selectively precharging the bit line based on the data to be programmed.

BRIEF DESCRIPTION OF THE DRAWINGS

The above and other features and aspects of the exemplary embodiments of the present invention will be described in detail with reference to the accompanying drawings, in which.

DETAILED DESCRIPTION OF THE EXEMPLARY EMBODIMENTS

Figure 1:
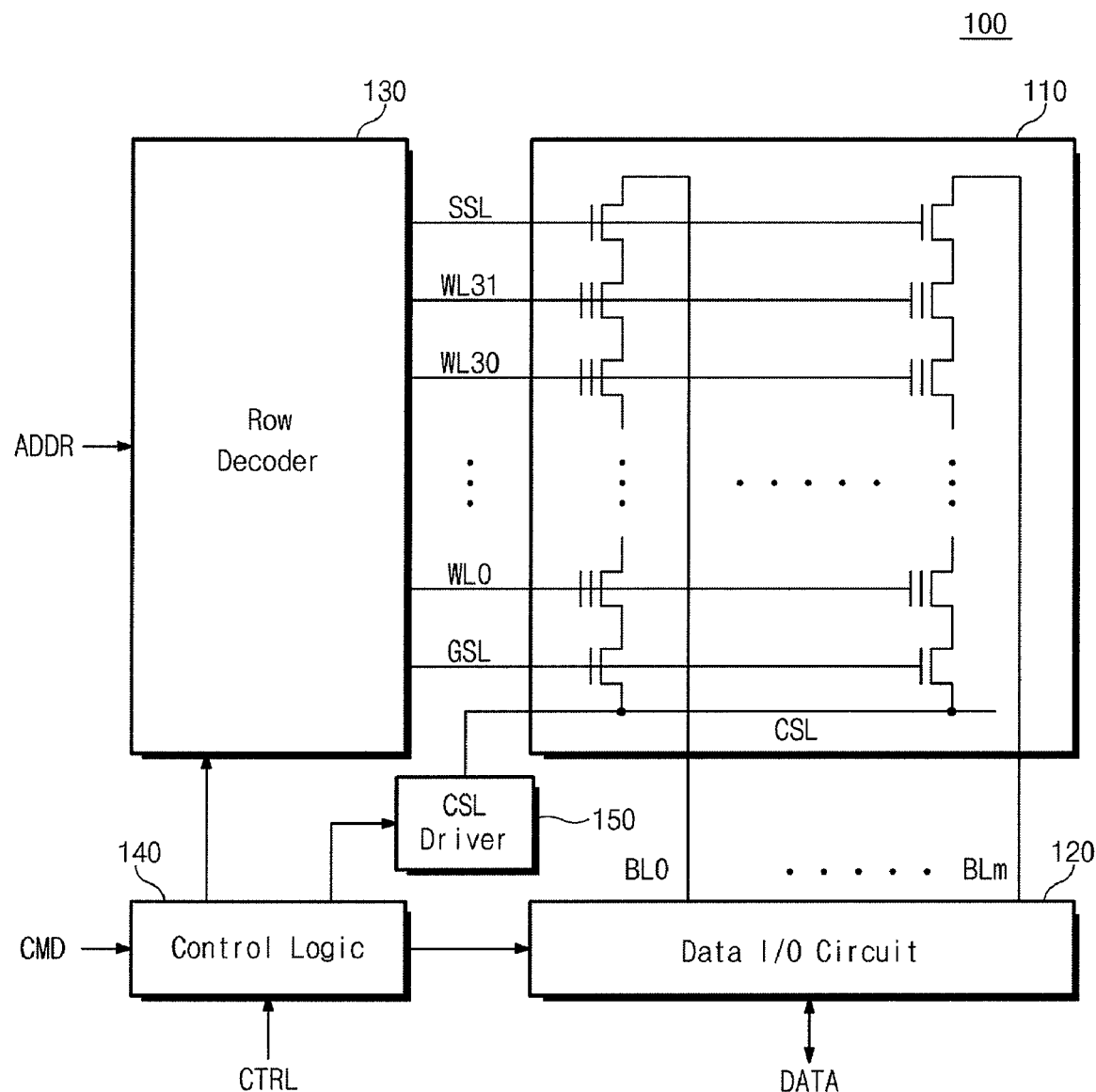
FIG. 1 is a block diagram of a flash memory device according to an exemplary embodiment of the present invention.

Exemplary embodiments of the present invention will now be described more fully hereinafter with reference to the accompanying drawings. This invention, however, may be embodied in many different forms and should not be construed as limited to the embodiments set forth herein. In the drawings, the thicknesses of layers and regions may be exaggerated for clarity. Like numbers may refer to like elements throughout the accompanying figures.

Exemplary embodiments of the present invention may provide for a flash memory device capable of reducing or eliminating widening of threshold voltage distribution due to noise in a common source line.

FIG. 1 is a block diagram of a flash memory device according to an exemplary embodiment of the present invention. Referring to FIG. 1, the flash memory device 100 includes a memory cell array 110, a data input/output circuit 120, a row decoder 130, a control logic 140, and a CSL driver 150.

The memory cell array 110 includes a plurality of memory blocks. In FIG. 1, one memory block is illustrated. The memory blocks each consist of a plurality of pages. The pages each consist of a plurality of memory cells. Multi bit data or single bit data may be stored in each of the memory cells. A flash memory performs an erase operation in units of a memory block, and performs a read or write operation in units of a page.

Each of the memory blocks consist of a plurality of cell strings. Each of the cell strings includes a plurality of memory cells connected between a bit line BL and a common source line CSL. Referring to FIG. 1, each of the cell strings includes a string selection transistor connected to a string selection line SSL, a plurality of memory cells connected to a plurality of word lines WL0-WL31, and a ground selection transistor connected to a ground selection line GSL. The string selection transistor is connected to bit lines BL0-BLm, and the ground selection transistor is connected to a common source line CSL.

Generally in a flash memory device 100, during a read operation, a power voltage Vcc is supplied to the string selection line SSL and the ground selection line GSL, a selecting read voltage Vrd is supplied to a selected word line (e.g., WL0), and a non-selecting read voltage Vread is supplied to a non-selected word lines WL1-WL31. The non-selecting read voltage Vread is a voltage sufficient to turn on the memory cell connected to the non-selected word lines WL1-WL31.

The data input/output circuit 120 is connected to the memory cell array 110 via a plurality of bit lines BL0-BLm. The data input/output circuit 120 receives data via a data input/output line (not shown). The data input/output circuit 120 temporarily stores data to be programmed in a selected memory cell of the plurality of memory cells. The data stored in the data input/output circuit 120 is programmed in a corresponding memory cell during program operation. Also, the data input/output circuit 120 reads data stored in a selected memory cell via a bit line BL. The read data is outputted to an external source via the data input/output line.

The data input/output circuit 120 retains data to be programmed during a program verify operation, and decreases noise in the common source line CSL by selectively precharging bit lines based on data to be programmed. Noise occurs when voltage drops due to resistance in the common source line CSL. The common source line CSL is generally connected to a ground terminal through a metal line. As the metal line may have resistance, a voltage drop occurs when current flows through the common source line CSL. The voltage drop in the common source line CSL may cause a threshold voltage distribution of the memory cell to be widened. Internal configuration and operation of the data input/output circuit 120 will be described in detail with reference to FIG. 5.

Referring on to FIG. 1, the row decoder 130 is connected to a memory cell array 110 via a plurality of word lines WL0-WL31. The row decoder 130 receives address ADDR as input and selects a memory block or a page. Here, an address for selecting a memory block is referred to as a block address, and an address for selecting a page is referred to as a page address.

The control logic 140 controls a data input/output circuit 120, a row decoder 130, and a CSL driver 150 in response to a command CMD and a control signal CTRL. Here, the control signal CTRL is provided from a memory interface (refer to FIG. 10, 210) or a memory controller (refer to FIG. 11, 712). The control logic 140 generates bias voltages to be provided to word lines during a write, read, and/or erase operation.

During a read operation, the control logic 140 generates a selecting read voltage Vrd provided to a selected word line, and non-selecting read voltage Vread provided to a non-selected word line. In general, a non-selecting read voltage Vread has a higher voltage level than a selecting read voltage Vrd. Also, during a program verify operation, the control logic 140 generates a program verify voltage Vvf provided to a selecting read voltage.

The CSL driver 150 is connected to a common source line CSL. The configuration and operation of the CSL driver 150 is described in detail with reference to FIG. 2. In a conventional flash memory device, due to resistance in the common source line CSL, noise occurs and the width of the threshold voltage distribution of the memory cell may be widened. The flash memory device 100 according to an exemplary embodiment of the present invention may address the problem of the widening of the threshold voltage distribution by decreasing noise in the common source line CSL.

Figure 2:
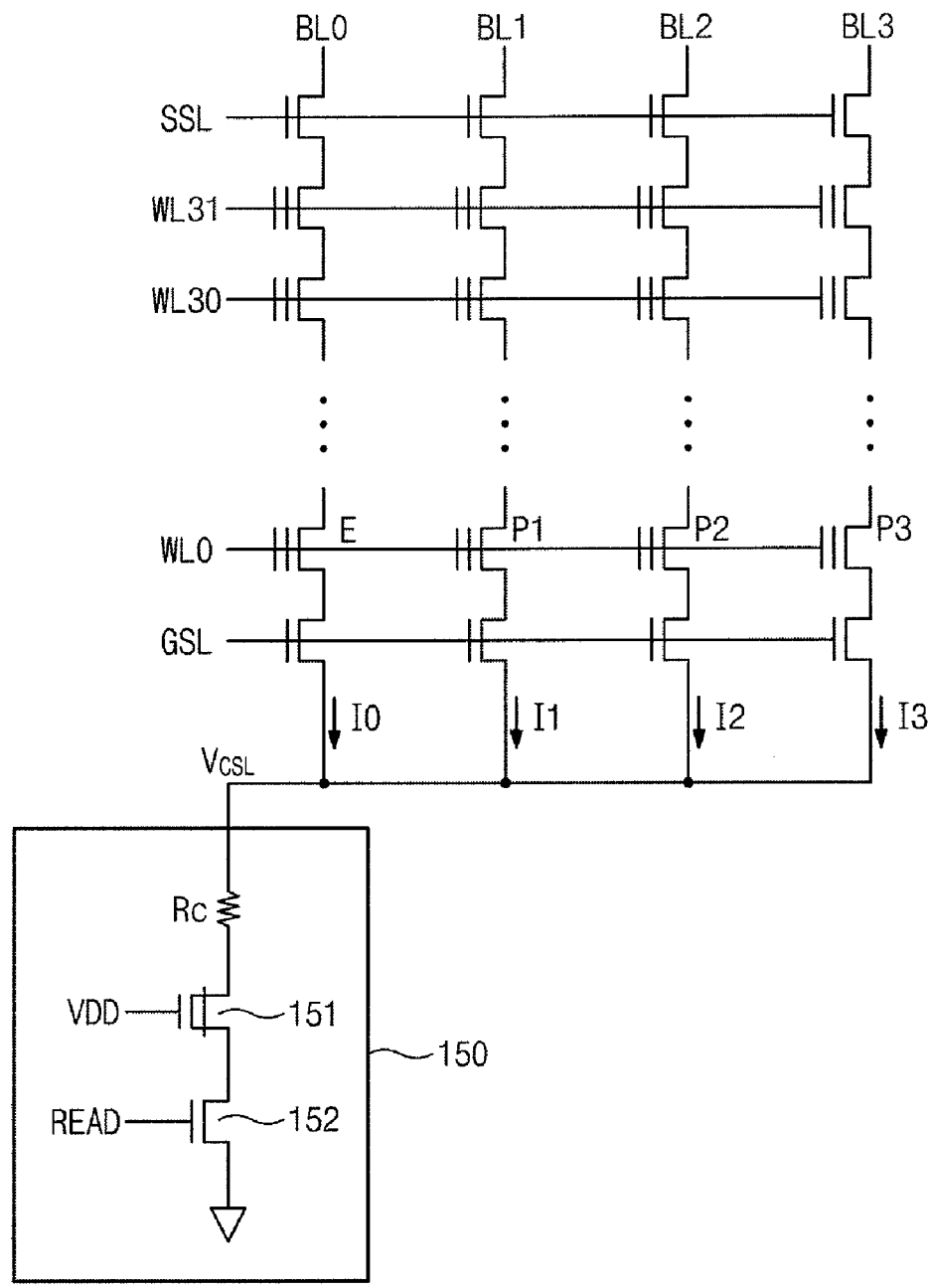
FIG. 2 is a circuit diagram of the CSL driver depicted in FIG. 1 according to an exemplary embodiment of the present invention.

FIG. 2 is a circuit diagram of the CSL driver depicted in FIG. 1 according to an exemplary embodiment of the present invention. Referring to FIG. 2, the CSL driver 150 includes a depletion-type MOS transistor 151 and an NMOS transistor 152.

In FIG. 2, Rc is a parasitic resistance or a parasitic capacitance (referred to as parasitic resistance hereinafter for the purposes of simplicity) existing in a common source line CSL. When current flows through a common source line CSL, a voltage drop may occur in the common source line CSL resulting from a parasitic resistance. The common source line CSL has a predetermined voltage level (referred to as a common source line voltage $V_{CSL}$). If a common source line voltage $V_{CSL}$ exists, the width of the threshold voltage distribution of the memory cell may widen during a program operation.

Referring on to FIG. 2, transistors 151 and 152 of the CSL driver 150 may be connected in series between the common source line CSL and the ground terminal. Power voltage VDD is supplied to a gate of the depletion-type MOS transistor 151, and a control signal READ is supplied to a gate of the NMOS transistor 152. The control signal READ is activated during read operations and deactivated during other operations. Here, the read operation includes a program verify operation as well as a general read operation. A depletion-type MOS transistor 151 is intended to prevent a NMOS transistor 152 from being damaged when a high voltage is supplied to the common source line CSL.

Referring on to FIG. 2, a plurality of cell strings are connected to the CSL driver 150. The respective cell strings are connected between bit lines BL and the common source lines CSL. In FIG. 2, four cell strings are connected between the bit lines BLi (i=0, 1, 2, 3) and common source lines CSL, for example. The common source line voltage $V_{CSL}$ changes according to current flow through the cell strings. During a read operation or a program verify operation, the current flow through the cell strings changes based on the number of on-cells.

The following two assumptions are made to observe change in the common source line voltage $V_{CSL}$ based on number of on-cells: Firstly, the memory cells connected to selected word line WL0 are assumed to be programmed in E, P1, P2, P3 states, respectively. Here, an E state is an erased state, and the memory cell in a P3 state has the highest threshold voltage. The memory cells in P1 and P2 states respectively have threshold voltages which are middle level between an E state and a P3 state. Secondly, the currents flowing through the respective cell strings are assumed to be I0, I1, I2, I3 when the memory cells connected to the selected word line WL0 are on-cells.

According to these assumptions, a common source line voltage $V_{CSL}$ changes based on number of on-cells. For example, if only the memory cells in E state are on-cells, and the rest of the memory cells are off-cells, the common source line voltage $V_{CSL}$ becomes I0*Rc. If the memory cells in E state and P1 state are on-cells, the common source line voltage $V_{CSL}$ becomes (I0+I1)*Rc. Similarly, if the memory cells in P1 and P2 states are on-cells, the common source line voltage $V_{CSL}$ becomes (I0+I1+I2)*Rc. This shows that the common source line voltage $V_{CSL}$ is subject to change based on number of on-cells during a program verify operation and a read operation.

Figure 3:
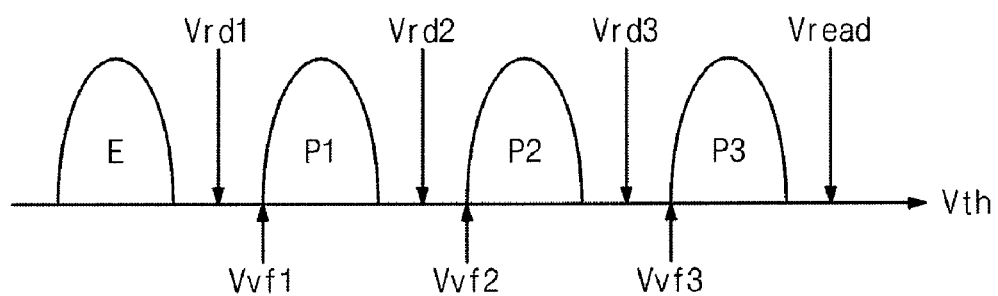
FIG. 3 is a diagram of a threshold voltage distribution of a memory cell depicted in FIG. 2.

FIG. 3 is a diagram of a threshold voltage distribution of a memory cell depicted in FIG. 2. Referring to FIG. 3, a memory cell may be programmed to have one of the four states E, P1, P2 or P3.

During a read operation, selecting read voltages Vrd1, Vrd2, Vrd3 are supplied to selected word line WL0, and non-selecting read voltage Vread is supplied to non-selected word lines WL1-WL31. The first selecting reading voltage Vrd1 has a voltage level between an erased state E and a first programmed state P1. The second selecting read voltage Vrd2 has a voltage level between a first programmed state P1 and a second programmed state P2. The third selecting read voltage Vrd3 has a voltage level between a second programmed state P2 and a second programmed state P3.

When the first selecting read voltage Vrd1 is supplied, the memory cell having an erased state E becomes an on-cell and memory cells having first to third programmed states P1, P2, P3 become off-cells. When the second selecting read voltage Vrd2 is supplied, the memory cell having a first programmed state P1 becomes an on-cell and memory cells having first to third programmed states P1, P2, P3 become off-cells. When the third selecting read voltage Vrd3 is supplied, the memory cells having an erased state E, a first programmed state P1, and a second programmed state P2 become on-cells and memory cells having third programmed state P3 become off-cells.

Program verify voltages Vvf1, Vvf2, Vvf3 are supplied to the selected word line during a program verify operation. The first program verify voltage Vvf1 is for programming a memory cell into a first programmed state P1, the second program verify voltage Vvf2 is for programming a memory cell into a second programmed state P2, and the third program verify voltage Vvf3 is for programming a memory cell into a third programmed state P3.

FIGS. 4 to 6 are diagrams illustrating the number of on-cells when a program verify voltage and a read voltage are supplied to selected word lines. FIGS. 4 to 6 show that the number of on-cells may vary in a program verify operation and in a read operation. As described in FIG. 2, when the number of on-cells of memory cells connected to selected word line change, the common source line voltage $V_{CSL}$ may also vary.

Figure 4A:
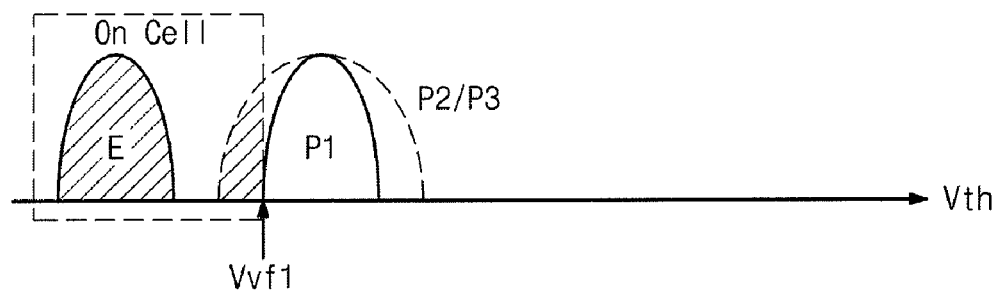
FIGS. 4A and 4B are diagrams of threshold voltage distributions during a program verify operation and a read operation of a first programmed state P1, respectively.
Figure 4B:
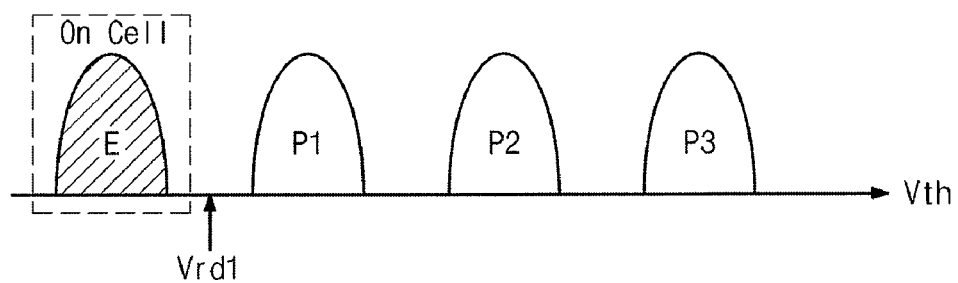

FIGS. 4A and 4B are diagrams of threshold voltage distributions of a program verify operation for programming selected memory cell into a first programmed state P1, and of a read operation for reading selected memory cell in the first programmed state P1, respectively.

FIG. 4A shows an on-cell distribution when a first program verify voltage Vvf1 is supplied. Referring to FIG. 4A, the shaded portion of the threshold voltage distribution represents the cells that become on-cells when the first program verify voltage Vvf1 is supplied. A memory cell in erased state E and a cell of which the threshold voltage has not reached the first program verify voltage Vvf1 may become an on-cell, among the cells to be programmed into a second or third programmed state P2 or P3.

FIG. 4B is a threshold voltage distribution diagram of on-cell when a first read voltage Vrd1 is supplied. Referring to FIG. 4B, the shaded portion represents the cells that become on-cells when a first read voltage Vrd1 is supplied. Here, only the memory cell in an erased state E is an on-cell. Unlike program verify operation, the read operation is performed after the entire program operation has ended. Therefore, the cells to be programmed into a second programmed state P2 or a third programmed state P3 are already in the second and third programmed states P2 and P3, respectively.

Thus the memory cell that becomes an on-cell when the first read voltage vrd1 is supplied is only the memory cell in the erased state E.

On comparing FIGS. 4A and 4B, even though the program verify operation and read operation are both operations for reading the first programmed state P1, the number of on-cells differs for the two different operations. For example, the number of on-cells during the program verify operation is higher than the number of on-cells during the reading operation. The difference in the number of on-cells is because the threshold voltage of a memory cell to be programmed in a second or third programmed state P2 or P3 that has not reached the first program verify voltage Vvf1.

Figure 5A:
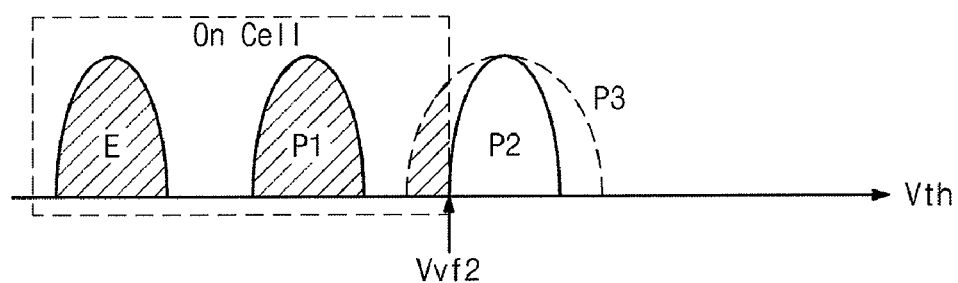
FIGS. 5A and 5B are diagrams of threshold voltage distributions during a program verify operation and a read operation of a second programmed state P2, respectively.
Figure 5B:
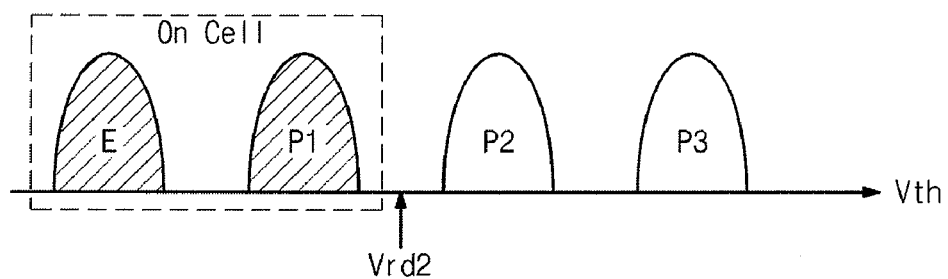

FIGS. 5A and 5B are diagrams of threshold voltage distributions of a program verify operation for programming a selected memory cell into a second programmed state P2, and of a reading operation for reading a selected memory cell in a second programmed state P2.

FIG. 5A depicts a distribution of on-cells when a second program verify voltage Vvf2 is supplied. The memory cells that become on-cells when the second program verify voltage Vvf2 is supplied are memory cells that are in the erased state E, in the first programmed state P1, and memory cells of which the threshold voltage has not reached a second program verify voltage Vvf2.

FIG. 5B depicts a distribution of on-cells when a second read voltage Vrd2 is supplied. Referring to FIG. 5B, the memory cell that becomes an on-cell when the second read voltage Vrd2 is supplied is a memory cell that is in an erased state E and a first programmed state P1. This is because the cells to be programmed into a third programmed state P3 are already in a third programmed state P3.

On comparing FIGS. 5A and 5B, the number of on-cells may change in a program verify operation and a read operation, although they are operations for reading a second programmed state P2. The number of memory cells that become on-cells in a program verify operation is higher than the number of memory cells that become on-cells in a read operation. The difference in the number of on-cells is because the threshold voltage of a memory cell to be programmed in a third programmed state P3 has not reached the second program verify voltage Vvf2.

Figure 6A:
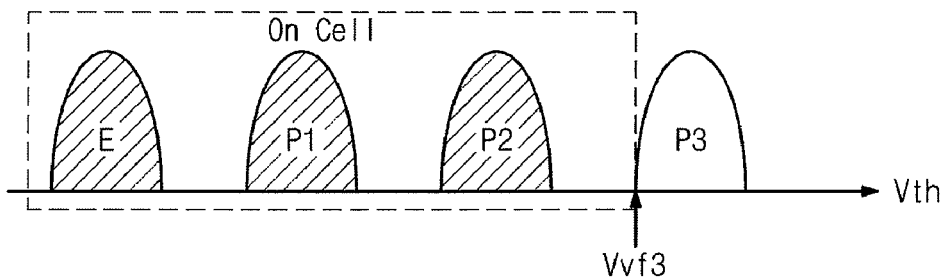
FIGS. 6A and 6B are diagrams of threshold voltage distributions during a program verify operation and a read operation of a third programmed state P3, respectively.
Figure 6B:
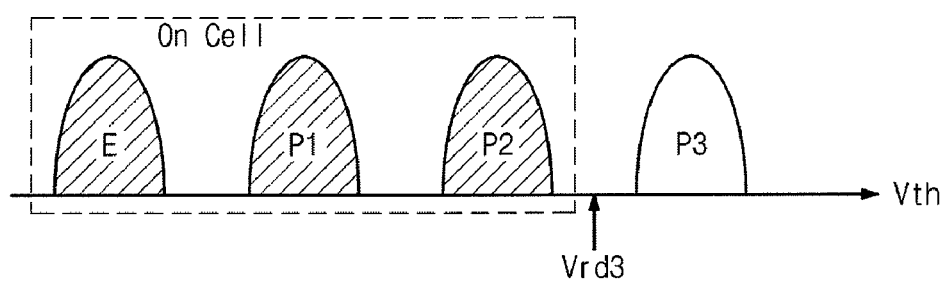

FIGS. 6A and 6B are diagrams of threshold voltage distributions of a program verify operation for programming a selected memory cell into a third programmed state P3, and of a read operation for reading a selected memory cell in a third programmed state P3.

FIG. 6A depicts a distribution of on-cells when a third program verify voltage Vvf3 is supplied. The memory cell that becomes an on-cell when the third program verify voltage Vvf3 is supplies is a memory cell in an erased state E, a first programmed state P1 or a second programmed state P2. FIG. 6B illustrates a distribution of on-cells when a third read voltage Vrd3 is supplied. Referring to FIG. 6B, the memory cell that becomes an on-cell when the third program verify voltage Vvf3 is supplies is a memory cell in an erased state E, a first programmed state P1 or a second programmed state P2.

On comparing FIGS. 6A and 6B, in an operation for reading a third programmed state P3, the number of on-cells in the program verify operation and in the reading operation becomes the same. This is because all the cells to be programmed into the third programmed state P3 reach a third program verify voltage Vvf3.

Referring to FIG. 4 to FIG. 6, the number of on-cells in a program verify operation for programming into P1 or P2 states may differ from number of on-cells in a reading operation for reading P1 or P2 states. If the number of on-cells changes during a program verify operation and a reading operation for the same states, the common source line voltage $V_{CSL}$ also changes as described above. Likewise, due to noise in the common source line CSL, the threshold voltage distribution of a memory cell may be widened. This is described in detail below with respect to FIG. 7.

Figure 7:
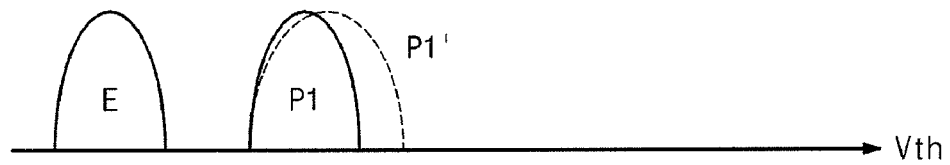
FIG. 7 is a diagram of a variation of a threshold voltage distribution due to difference in a common source line voltage between a program verify operation and a read operation.

FIG. 7 is a diagram depicting the widening of a threshold voltage distribution due to noise in the common source line voltage. FIG. 7 illustrates a first programmed state P1, but the change in the threshold voltage distribution is the same in a second programmed state P2.

As described above, the number of on-cells may increase in a program verify operation relative to a read operation. When the number of on-cells during a program verify operation increases, the current flow in the common source line also increases. If the current flow in the common source line increases, the common source line voltage also increases due to influences such as parasitic resistance. If the common source line voltage increases, the threshold voltage distribution of the memory cells widen as shown by the dotted lines P1' of FIG. 7.

Figure 8:
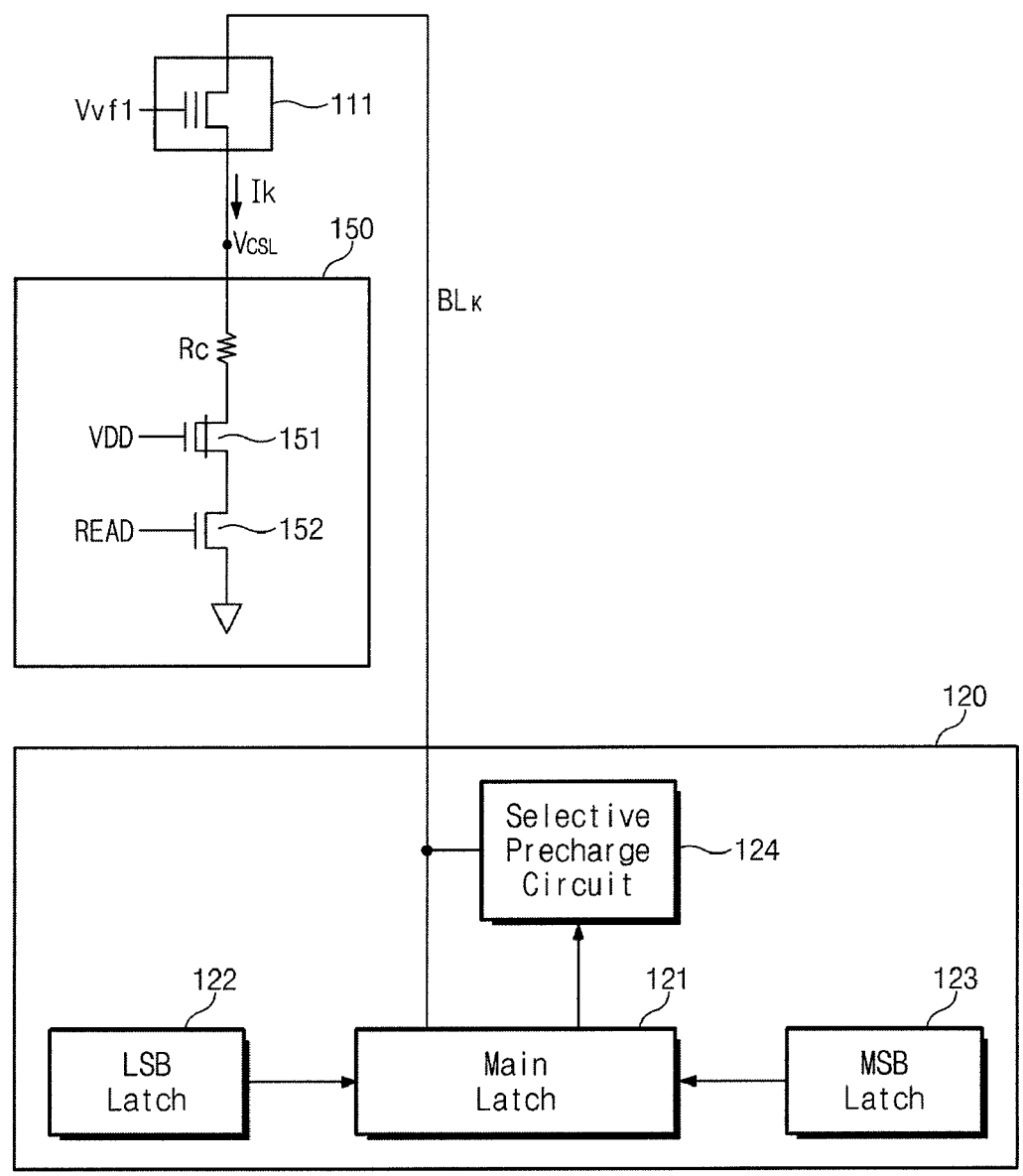
FIG. 8 is a schematic block diagram of the data input/output circuit depicted in FIG. 1.

FIG. 8 is a block diagram of the data input/output circuit in FIG. 1. Referring to FIG. 8, the data input/output circuit 120 includes a main latch 121, data latches 122 and 123, and a selective precharge circuit 124. The number of data latches 122 and 123 changes depending on number of data bits stored in a memory cell. For example, where 2-bit data are stored in one memory cell, the data latch includes the least significant bit LSB latch 122 and the most significant bit MSB latch 123 as shown in FIG. 8.

The main latch 121 is connected to a bit line BLk, and stores result of a program verify operation. For example, if the program passes as a result of a program verify operation, the main latch 121 changes into a pass data (or, data '1'). If the program fails, the data to be programmed (or, data '0') is maintained.

The main latch 121 controls the selective precharge circuit 124 depending on data stored in the LSB latch 122 and the MSB latch 123 during a program verify operation. The main latch 121 selectively precharges the bit lines BLk in a program verify operation so as to decrease noise in the common source line CSL.

Assuming that data corresponding to P1 are stored in the data latches 122 and 123, and a P1 program verify operation is performed, the main latch 121 generates a selective signal SEL according to control of data latches 122 and 123. The selective precharge circuit 124 precharges the bit line BLk in response to the selective signal SEL. Where data corresponding to P2 or P3 are stored in the data latches 122 and 123, the main latch 121 does not generate a selective signal SEL. Here, the bit line BLk maintains the ground voltage.

In the same way, where data corresponding to P2 are stored in the data latches, and P2 program verify operation is performed, the main latch 121 generates a selective signal SEL. Also, where data corresponding to P3 are stored in the data latches and P3 program verify operation is performed, the main latch 121 generates a selective signal SEL.

In a program verify operation, the main latch 121 generates selective signal SEL when the program verify operation is performed. The program verify operation corresponds to data stored in the data latches 122 and 123. When the main latch 121 performs a program verify operation that does not correspond to data stored in the data latches 122 and 123, the main latch 121 does not generate a selective signal SEL.

The LSB latch 122 is a circuit for storing LSB data, and the MSB latch 123 is a circuit for storing MSB data. The LSB latch 122 maintains LSB data and the MSB latch 123 maintains MSB data during a program verify operation. The LSB latch 122 and the MSB latch 123 maintain multi bit data until a program operation has ended.

The selective precharge circuit 124 selectively precharges bit line BLk according to the control of the main latch 121 during a program verify operation. The selective precharge circuit 124 may be realized as one or more MOS transistors that provide, in a simple way, precharge voltage to bit line BLk in accordance with the control of a selective signal SEL.

The selectively precharged bitline BLk is connected to a selected memory cell 111 of the memory cell array 110 which is precharged by the bit line BLk in accordance with the control of the selective signal SEL. The selected memory cell 111 provides a selected current Ik to the CSL driver 150.

Figure 9A:
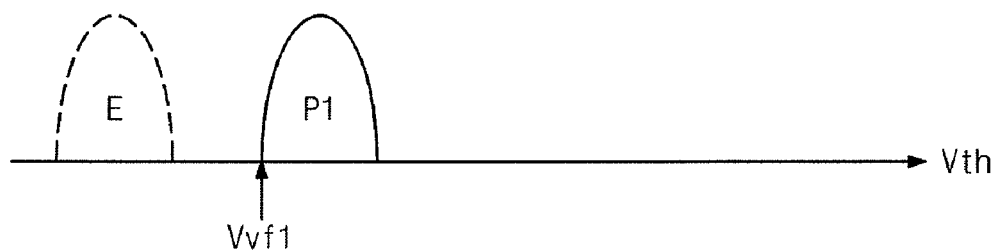
FIGS. 9A, 9B and 9C are diagrams of threshold voltage distributions of program verify operations of a first to third programmed states P1, P2 and P3.
Figure 9B:
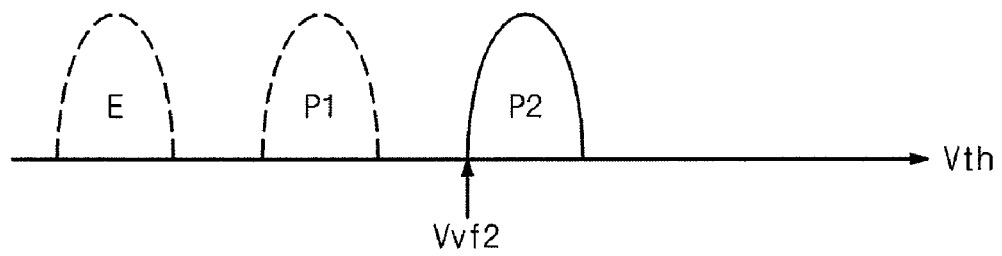
Figure 9C:
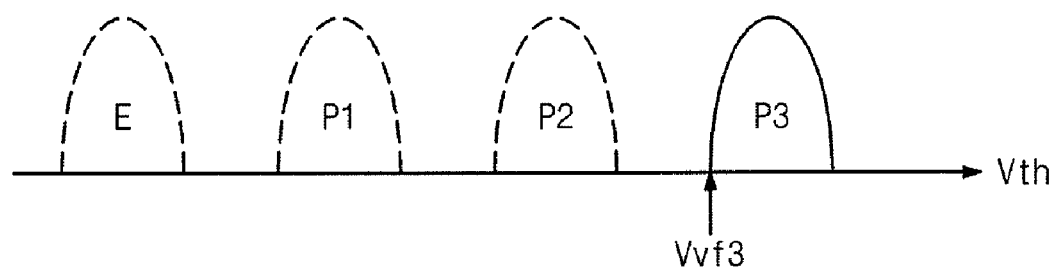

FIGS. 9A, 9B, and 9C are diagrams of threshold voltage distributions during a program verify operation on a first to third programmed state P1, P2 and P3. In FIG. 9, the solid lines show precharged corresponding bit lines during a program verify operation, and the dotted lines show unprecharged bit lines.

FIG. 9A depicts precharged bit line corresponding to a first programmed state P1 where a first program verify voltage Vvf1 is supplied. In FIG. 9A, the bit line corresponding to an erased state E is not precharged. FIG. 9B depicts precharging of the bit line corresponding to a second programmed state P2 where a second program verify voltage Vvf2 is supplied. In FIG. 9B, the bit lines corresponding to erased state E and first programmed state P1 are not precharged. Similarly, in FIG. 9C, the bit line corresponding to a third programmed sate P2 is precharged, but the bit lines corresponding to the other states E, P1 and P2 are not precharged.

The flash memory device according to an exemplary embodiment selectively precharges bit lines according to program data stored in data in an input/output circuit during a program verify operation. According to the exemplary embodiment, widening of threshold voltage distribution of memory cell may be prevented by decreasing noise of the common source line CSL in a program verify operation.

Figure 10:
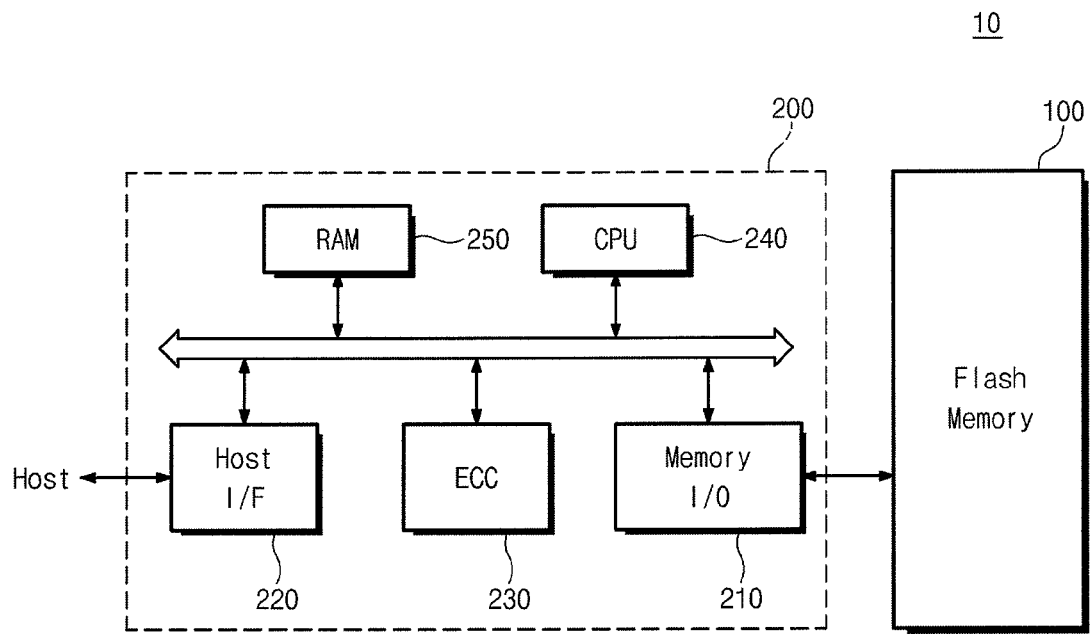
FIG. 10 is a block diagram of a memory system according to an exemplary embodiment of the present invention.

FIG. 10 is a block diagram of a memory system according to an exemplary embodiment of the present invention. Referring to FIG. 10, a semiconductor memory device 10 includes a flash memory device 100 and a memory controller 200. Here, the flash memory device 100 is a non-volatile memory device, which performs write, read and erase operations according to the control of the memory controller 200.

The memory controller 200 provides a read command RD_CMD, address ADDR, and control signal CTRL during a read operation. The flash memory device 100 receives the read command and the address from the memory controller 200, and provides read voltage to a corresponding word line.

The memory controller 200 includes a memory interface 210, a host interface 220, an ECC circuit 230, a CPU 240, and a random access memory RAM 250. The RAM 250 is used as a working memory. The host interface 220 includes a protocol for exchanging data with the host.

The ECC circuit 230 is used to analyze or correct bit error in the data stored in the flash memory device 100. The memory interface 210 is directly connected to the flash memory device 100 and is used to exchange command, address, data and control signals. The CPU 240 performs the entire control operations for exchanging data of the memory controller 200. Although not shown in drawing, the semiconductor memory device 100 may be further provided with an ROM (not shown) for storing code data for interfacing with the host.

Figure 11:
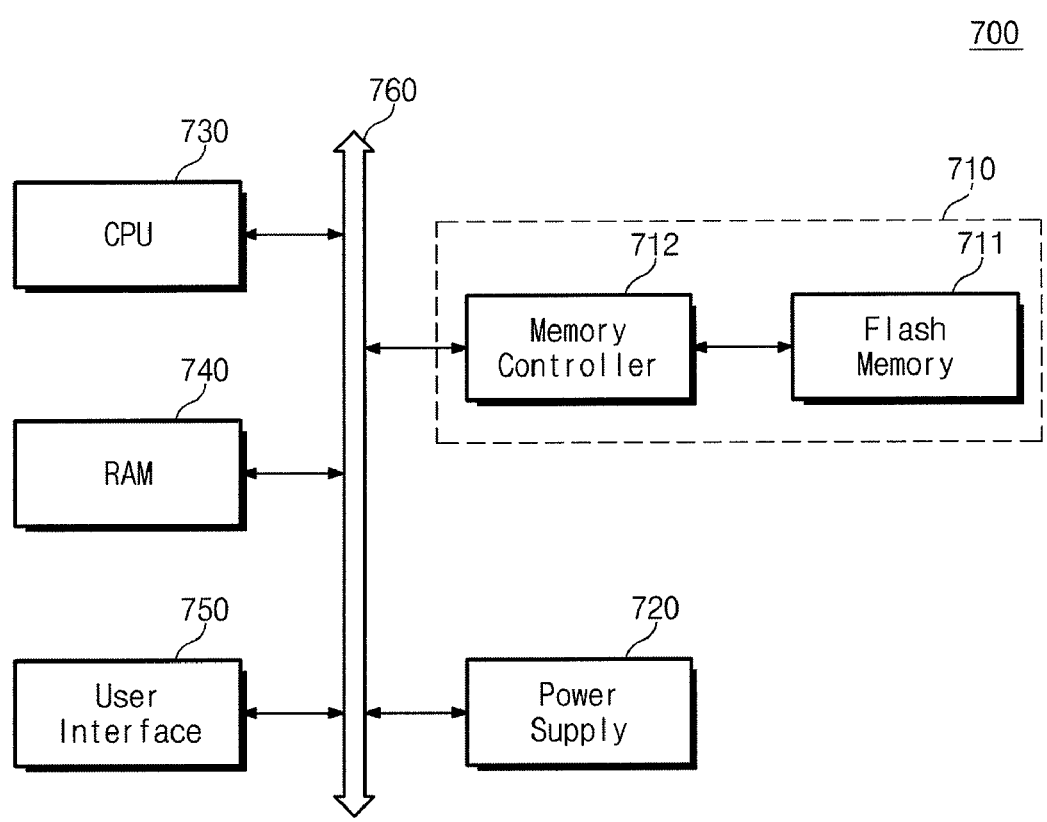
FIG. 11 is a block diagram including a semiconductor memory device according to an exemplary embodiment of the present invention.

FIG. 11 is a block diagram of a memory system including a semiconductor memory device according to an exemplary embodiment of the present invention. Referring to FIG. 11, a memory system 700 includes a semiconductor memory device 710, a power supplier 720, a CPU 730, a RAM 740, a user interface 750, and a system bus 760.

The semiconductor memory device 710 includes a flash memory 711 and a memory controller 712. The semiconductor memory device 710 may be designed using a single product flash memory, or may be realized as one integrated circuit, for example, a single memory chip based on NAND architecture integrating SRAM buffers and a logic interface such as OneNAND™ offered by Samsung Electronics Co., Ltd. The flash memory 711 receives information, e.g., read command and address from the memory controller 712, and analyzes error correction code ECC or controls level of a selecting read voltage Vrd or non-selecting read voltage Vread.

The semiconductor memory device 710 is electrically connected to the power supplier 720, CPU 730, RAM 740, user interface 750, via a system bus 760. In the flash memory 711, data provided via the user interface 750 or data processed via the CPU 730 are stored by the memory controller 712.

Where the semiconductor memory device 710 is mounted as the solid state disk drive, the booting speed of the memory system 700 may be significantly enhanced. Although not shown in the drawing, the memory system of FIG. 11 may be used in devices such as an application chipset and a camera image processor.

The flash memory and/or the controller according to exemplary embodiments of the present invention may be mounted using various forms of packages. The flash memory and/or the controller 120 may be mounted using packages, for example, PoP (Package on Package), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Although the present invention has been described in connection with exemplary embodiment of the present invention illustrated in the accompanying drawings, it is not limited thereto. Persons with skill in the art will recognize that embodiments of the present invention may be applied to other types of memory devices.

What is claimed is:

1. A flash memory device comprising:
    a plurality of memory cells connected between a bit line and a common source line; and
    a data input/output circuit connected to the bit line, and configured to store data to be programmed in a selected memory cell among the plurality of memory cells,
    wherein the data input/output circuit is configured to maintain the data to be programmed within the data input/output circuit during a program verify operation, and to decrease noise in the common source line by selectively precharging the bit line based on the data to be programmed.

2. The flash memory device of claim 1, wherein the plurality of memory cells are characterized as multi-level cells (MLC).

3. The flash memory device of claim 1, wherein the data input/output circuit comprises:
    a main latch configured to store a result of a program verify operation; and a data latch configured to maintain the data to be programmed.

4. The flash memory device of claim 3, wherein the data latch is configured to maintain the data to be programmed until a program operation has ended.

5. The flash memory device of claim 3, wherein the data input/output circuit further comprises:
a selective precharge circuit configured to selectively precharge the bit line in the program verify operation.

6. The flash memory device of claim 5, wherein the selective precharge circuit is connected to the bit line, and comprises a MOS transistor.

7. The flash memory device of claim 1 further comprising:
a CSL driver, for driving the common source line, connected between the common source line and a ground terminal.

8. The flash memory device of claim 7, wherein the CSL driver includes a depletion-type MOS transistor and an NMOS transistor.

9. The flash memory device of claim 8, wherein a power voltage VDD is supplied to a gate of the depletion-type MOS transistor and a control signal READ, activated during read and program verify operations and deactivated during other operations, is supplied to a gate of the NMOS transistor.

10. A method for performing a program verify operation of a flash memory device including a plurality of memory cells connected between a bit line and a common source line, and a data input/output circuit connected to the bit line, the program verify operation comprising:
storing data to be programmed in a selected memory cell of the plurality of memory cells in the data input/output circuit;
programming the data to be programmed in the selected memory cell; and
verifying the proper programming of the data to be programmed in the selected memory cell,
wherein the data input/output circuit is configured to maintain the data to be programmed during the program verify operation, and to decrease noise in the common source line by selectively precharging the bit line based on the data to be programmed.

11. The method of claim 10, wherein a main latch of the data input/output circuit stores a result of a program verify operation and a data latch of the data input/output circuit maintains the data to be programmed.

12. The method of claim 11, wherein the data latch maintains the data to be programmed until a program operation has ended.

13. The method of claim 10, wherein a selective precharge circuit of the data input/output circuit selectively precharges the bit line in the program verify operation.

14. A memory system comprising:
a flash memory device; and
a memory controller configured to control the flash memory device, wherein the flash memory device includes:
a plurality of memory cells connected between a bit line and a common source line; and
a data input/output circuit connected to the bit line, and configured to store data to be programmed in a selected memory cell of the plurality of memory cells,
wherein the data input/output circuit is configured to maintain the data to be programmed during a program verify operation, and to decrease noise in the common source line by selectively precharging the bit line based on the data to be programmed.

15. The memory system of claim 14, wherein the flash memory device and the memory controller are included in a single memory card.

16. The memory system of claim 14, wherein the flash memory device and the memory controller are included in a solid state disk drive.

17. The memory system of claim 14, wherein the flash memory device and the memory controller are included in a single memory chip based on NAND architecture integrating SRAM buffers and a logic interface.

18. The memory system of claim 14, wherein the data input/output circuit comprises:
a main latch configured to store a result of a program verify operation; and
a data latch configured to maintain the data to be programmed.

19. The memory system of claim 18, wherein the data latch is configured to maintain the data to be programmed until a program operation has ended.

20. The memory system of claim 18, wherein the data input/output circuit further comprises:
a selective precharge circuit configured to selectively precharge the bit line in the program verify operation.

* * * * *